United States Patent
Sunada et al.

(10) Patent No.: US 7,968,943 B2
(45) Date of Patent: Jun. 28, 2011

(54) SEMICONDUCTOR DEVICE REDUCING OUTPUT CAPACITANCE DUE TO PARASITIC CAPACITANCE

(75) Inventors: Takuya Sunada, Higashiosaka (JP);
Kazuhiko Kusuda, Higashiosaka (JP);
Takeshi Yoshida, Kawachinagano (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 35 days.

(21) Appl. No.: 12/474,700

(22) Filed: May 29, 2009

(65) Prior Publication Data

US 2009/0321827 A1 Dec. 31, 2009

(30) Foreign Application Priority Data

Jun. 25, 2008 (JP) ................................. 2008-165591

(51) Int. Cl.
*H01L 29/76* (2006.01)

(52) U.S. Cl. ......... 257/343; 257/330; 257/335; 438/270

(58) Field of Classification Search .................. 257/330, 257/335, 343, 347, E29.201, E29.257; 438/270
See application file for complete search history.

(56) References Cited

U.S. PATENT DOCUMENTS

| 6,580,126 B1 * | 6/2003 | Suzumura et al. ............ 257/343 |
| 2008/0038921 A1 | 2/2008 | Gouda et al. | |

FOREIGN PATENT DOCUMENTS

JP   11-186555   7/1999

OTHER PUBLICATIONS

English language Abstract of JP 11-186555, Jul. 9, 1999.

* cited by examiner

*Primary Examiner* — Theresa T Doan
(74) *Attorney, Agent, or Firm* — Greenblum & Bernstein, P.L.C.

(57) ABSTRACT

Plural through-holes are formed in a region of a semiconductor substrate positioned below a drain region (an element region other than a P-type well region). According to this configuration, an opposing area of the drain region and the semiconductor substrate can be reduced. Therefore, a drain-substrate capacitance Cdsub is reduced, and an output capacitance Coss of an SOI LDMOSFET can be reduced as a result.

5 Claims, 4 Drawing Sheets

SEMICONDUCTOR DEVICE REDUCING OUTPUT CAPACITANCE DUE TO PARASITIC CAPACITANCE

CROSS REFERENCE TO RELATED APPLICATION

This application is based upon and claims the benefit of priority from a Japanese Patent Application No. TOKUGAN 2008-165591, filed on Jun. 25, 2008; the entire contents of which are incorporated herein by reference.

BACKGROUND OF THE INVENTION

1. Field of the Invention

The present invention relates to a lateral double diffused MOS field effect transistor using an SOI (Silicon On Insulator) substrate, a so-called SOI LDMOSFET (Lateral Double Diffused MOSFET).

2. Description of the Related Art

Conventionally, semiconductor relay has been known as a switching element which turns on and off a signal and power. The semiconductor relay includes in a package a light emitting element such as a light emitting diode, a light receiving element such as a photodiode, and a semiconductor switching element which is turned on and off by an output of the light receiving element. For the semiconductor switching element, a power MOSFET having no offset of an output signal to an input signal and having a high breakdown voltage is generally used.

A semiconductor switching element used for a semiconductor relay is desired to have a small capacitance between output terminals of a relay relevant to a high-frequency signal shielding performance at an off time. A main component which determines this capacitance between the output terminals becomes an output capacitance of the power MOSFET. Based on this background, in recent years, there has been proposed to use for a semiconductor switching element an LDMOSFET using an SOI substrate, a so-called SOI LDMOSFET, capable of reducing an output capacitance and reducing a size by integration than those of a conventional VDMOSFET (Vertical Double Diffused MOSFET) (see Japanese Patent Application Laid-open No. H11-186555).

A parasitic capacitance of the SOI LDMOSFET includes a gate-drain capacitance Cgd, a gate-source capacitance Cgs, a drain-source capacitance Cds, a drain-substrate capacitance Cdsub, and a source-substrate capacitance Cssub. An output capacitance Coss of the SOI LDMOSFET becomes a sum (Cgd+Cds+Cdsub) of the gate-drain capacitance Cgd, the drain-source capacitance Cds, and the drain-substrate capacitance Cdsub. However, according to the conventional SOI LDMOSFET, the drain-substrate capacitance Cdsub has a size that cannot be disregarded. Therefore, it is difficult to further reduce the output capacitance Coss.

The present invention has been achieved to solve the above problems, and an object of the invention is to provide a semiconductor device capable of reducing an output capacitance.

SUMMARY OF THE INVENTION

A first aspect of the present invention provides a semiconductor device comprising: an SOI substrate made of a semiconductor substrate and a first conductive semiconductor layer formed on the semiconductor substrate via a first insulation layer; a first conductive drain region formed within the first conductive semiconductor layer so as to be exposed to a surface of the first conductive semiconductor layer; a second conductive well region formed within the first conductive semiconductor layer so as to reach the first insulation layer from the surface of the first conductive semiconductor layer isolated from the first conductive drain region; a first conductive source region included inside the second conductive well region and formed within the first conductive semiconductor layer so as to be exposed to the surface of the first conductive semiconductor layer; a drain electrode electrically connected to the first conductive drain region; a source electrode electrically connected to the first conductive source region; and a gate electrode formed via a second insulation layer on a surface of the second conductive well region present between the first conductive drain region and the first conductive source region, wherein a plurality of through-holes are formed in a region of the semiconductor substrate positioned below the drain region.

A second aspect of the present invention provides a semiconductor device comprising: an SOI substrate made of a semiconductor substrate and a first conductive semiconductor layer formed on the semiconductor substrate via a first insulation layer; a first conductive drain region formed within the first conductive semiconductor layer so as to be exposed to a surface of the first conductive semiconductor layer; a second conductive well region formed within the first conductive semiconductor layer so as to reach the first insulation layer from the surface of the first conductive semiconductor layer isolated from the first conductive drain region; a first conductive source region included inside the second conductive well region and formed within the first conductive semiconductor layer so as to be exposed to the surface of the first conductive semiconductor layer; a drain electrode electrically connected to the first conductive drain region; a source electrode electrically connected to the first conductive source region; and a gate electrode formed via a second insulation layer on a surface of the second conductive well region present between the first conductive drain region and the first conductive source region, wherein at least a region of the semiconductor substrate positioned below the drain region is removed except a region below a drain pad electrically connected to a surface of the drain electrode.

BRIEF DESCRIPTION OF THE DRAWINGS

Examples of the invention will become more fully apparent from the following description and appended claims, taken in conjunction with the accompanying drawings. Understanding that these drawings depict only examples and are, therefore, not to be considered limiting of the invention's scope, the examples of the invention will be described with additional specificity and detail through use of the accompanying drawings in which:

DETAILED DESCRIPTION OF THE PREFERRED EMBODIMENTS

A configuration of a semiconductor device according to first and second embodiments of the present invention will be explained below with reference to the accompanying drawings.

First Embodiment

Figure 1:
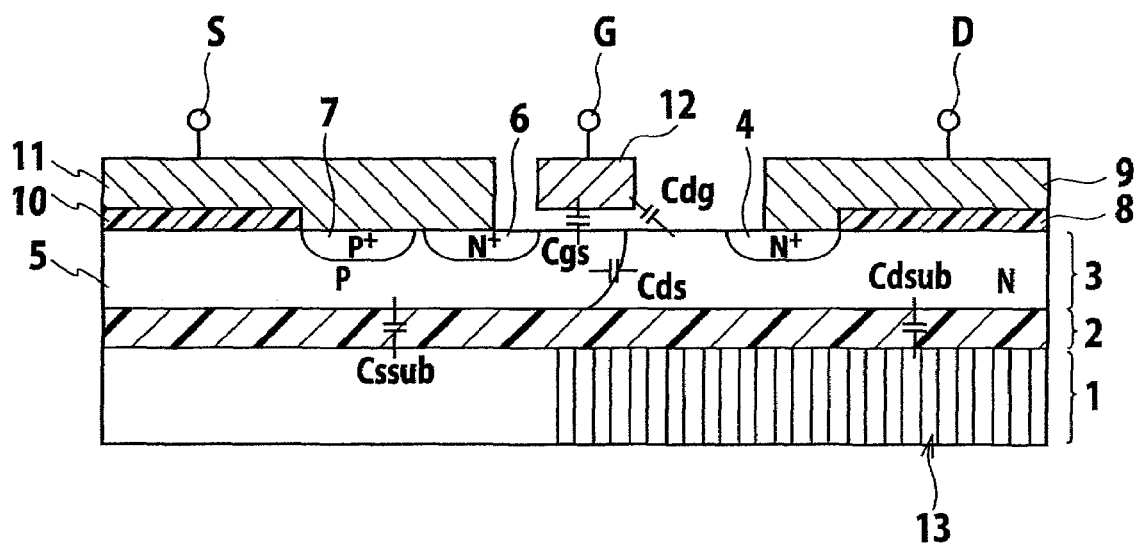
FIG. 1 is a sectional view showing a configuration of a semiconductor device according to a first embodiment of the present invention.
Figure 2:
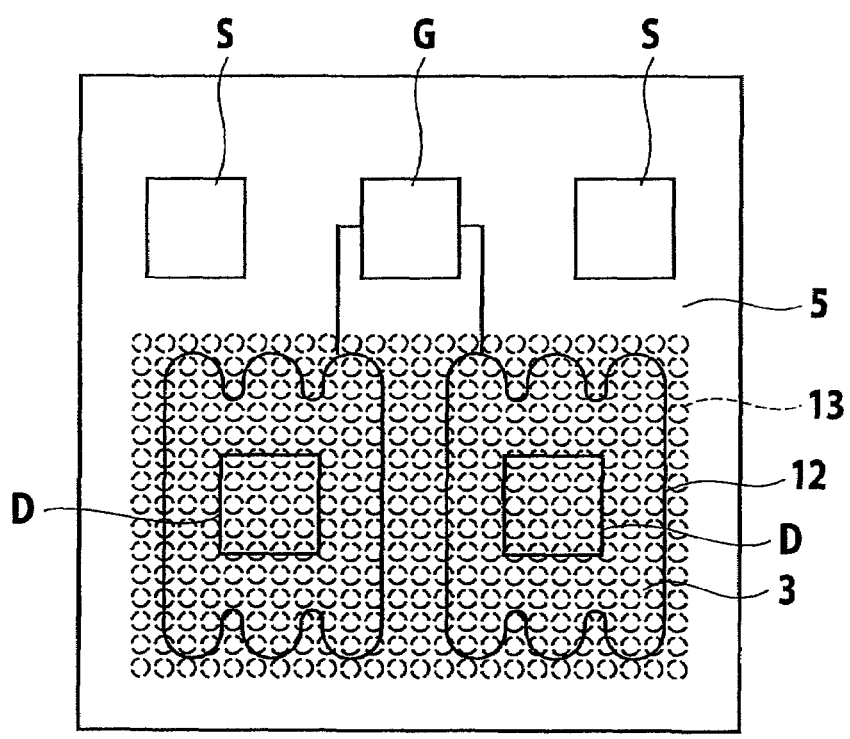
FIG. 2 is a top view showing the configuration of the semiconductor device according to the first embodiment.

The configuration of the semiconductor device according to the first embodiment is explained below with reference to FIG. 1 and FIG. 2.

The semiconductor device according to the first embodiment has an SOI configuration including a semiconductor substrate 1 formed by monocrystalline silicon, an insulation layer 2 such as a silicon oxide film formed on one surface of the semiconductor substrate 1, and an N-type semiconductor layer 3 such as an N-type silicon layer formed on a surface of the insulation layer 2. On the N-type semiconductor layer 3, there are formed an $N^+$-type drain region 4 formed to be exposed to a surface of the N-type semiconductor layer 3, and a P-type well region 5 formed to reach the insulation layer 2 from the surface of the N-type semiconductor layer 3 isolated from the $N^+$-type drain region 4. On the P-type well region 5, there are formed an $N^+$-type source region 6 formed to be exposed to a surface of the P-type well region 5, and a P+ body contact region 7 formed to be exposed to the surface of the P-type well region 5 isolated from the $N^+$-type source region 6.

A drain electrode 9 is formed on the surface of the N-type semiconductor layer 3 via an insulation film 8. This drain electrode 9 is electrically connected to the $N^+$-type drain region 4. A source electrode 11 is formed on the surface of the P-type well region 5 via an insulation film 10. This source electrode 11 is electrically connected to the $N^+$-type source region 6 and the P+ body contact region 7. A gate electrode 12 is formed via an insulation layer (not shown) on the surface of the P-type well region 5 present between the $N^+$-type drain region 4 and the $N^+$-type source region 6. A drain electrode pad D, a source electrode pad S, and a gate electrode pad G electrically connected to corresponding electrodes are formed on the surfaces of the drain electrode 9, the source electrode 11, and the gate electrode 12, respectively.

As described above, the semiconductor device according to the first embodiment is configured by a so-called SOI LDMOSFET. The output capacitance Coss of this SOI LDMOSFET becomes the sum (Cgd+Cds+Cdsub) of the gate-drain capacitance Cgd, the drain-source capacitance Cds, and the drain-substrate capacitance Cdsub. As shown in FIG. 1, the semiconductor device according to the first embodiment has plural through-holes 13 formed in a region of the semiconductor substrate 1 positioned below a drain region (an element region other than the P-type well region 5).

According to this configuration, the opposing area of the drain region and the semiconductor substrate 1 can be small. Therefore, the drain-substrate capacitance Cdsub is reduced, and the output capacitance Coss of the SOI LDMOSFET can be reduced as a result.

Figure 3:
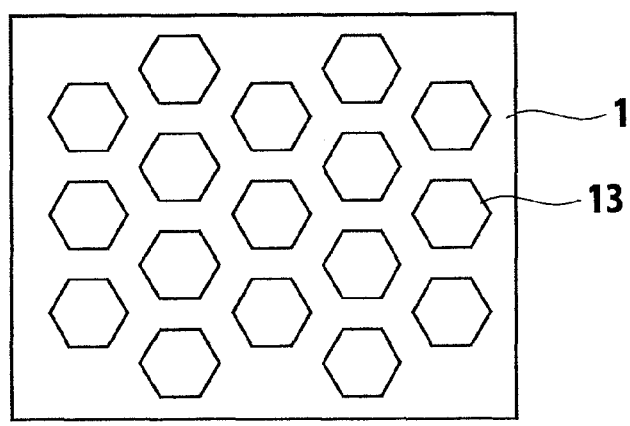
FIG. 3 is a top view showing a configuration of a first modification of the semiconductor device according to the first embodiment.
Figure 4:
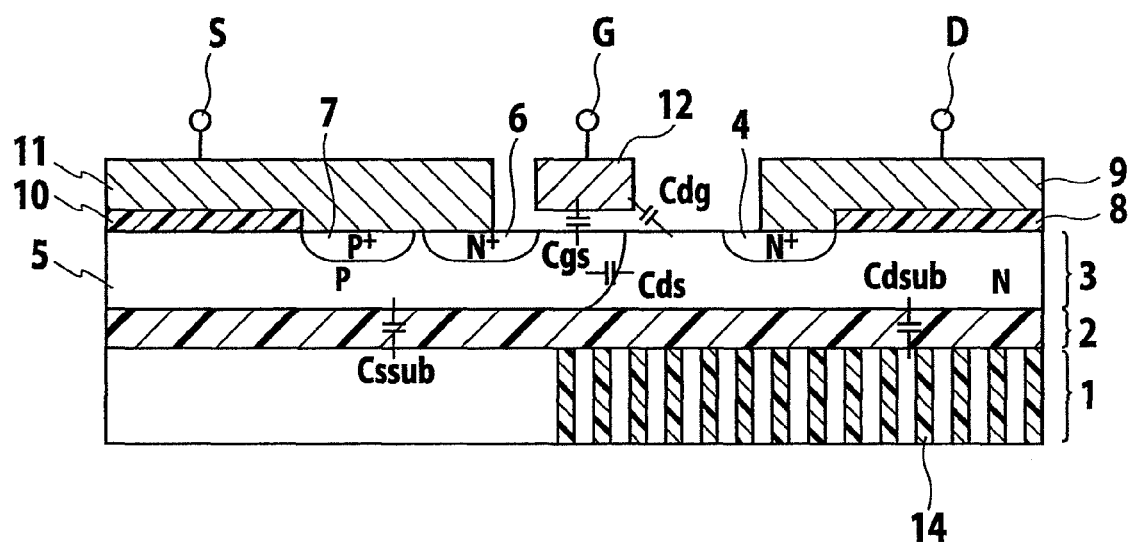
FIG. 4 is a sectional view showing a configuration of a second modification of the semiconductor device according to the first embodiment.

In this configuration, the plural through-holes 13 are provided by arranging plural small holes. Therefore, the semiconductor substrate 1 has strength that can sufficiently bear force vertically applied to the semiconductor substrate 1 at the time of boding wires to the drain electrode pad D. Alternatively, as shown in FIG. 3, the plural through-holes 13 can be arranged in a honeycomb shape (a hexagonal shape), thereby increasing the strength of the semiconductor substrate 1. Alternatively, as shown in FIG. 4, an insulation material 14 used to form a PSG film or a TEOS film can be filled into the through-holes 13, thereby further increasing the strength of the semiconductor substrate 1.

Second Embodiment

Figure 5:
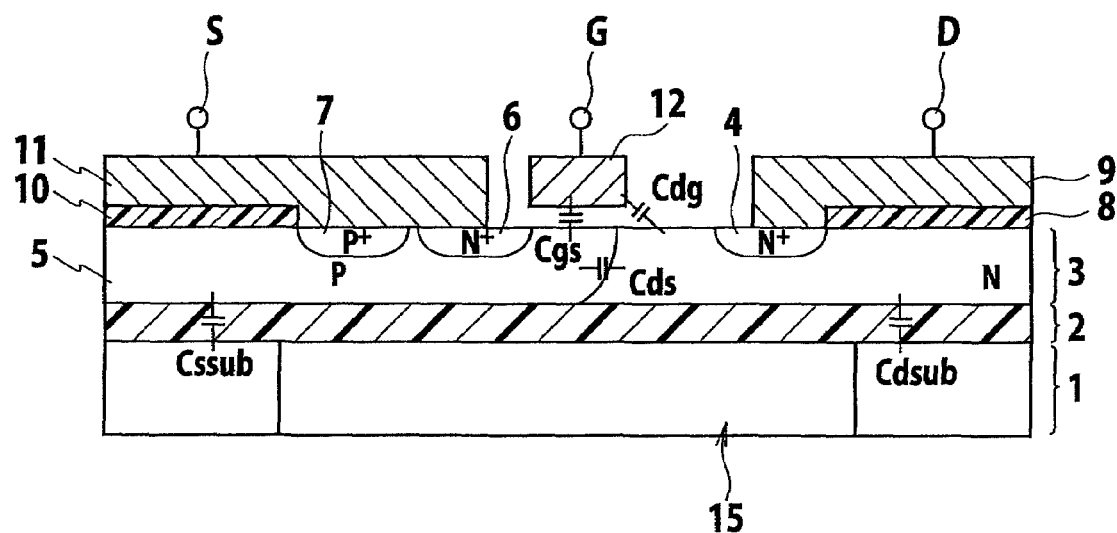
FIG. 5 is a sectional view showing a configuration of a semiconductor device according to a second embodiment of the present invention.
Figure 6:
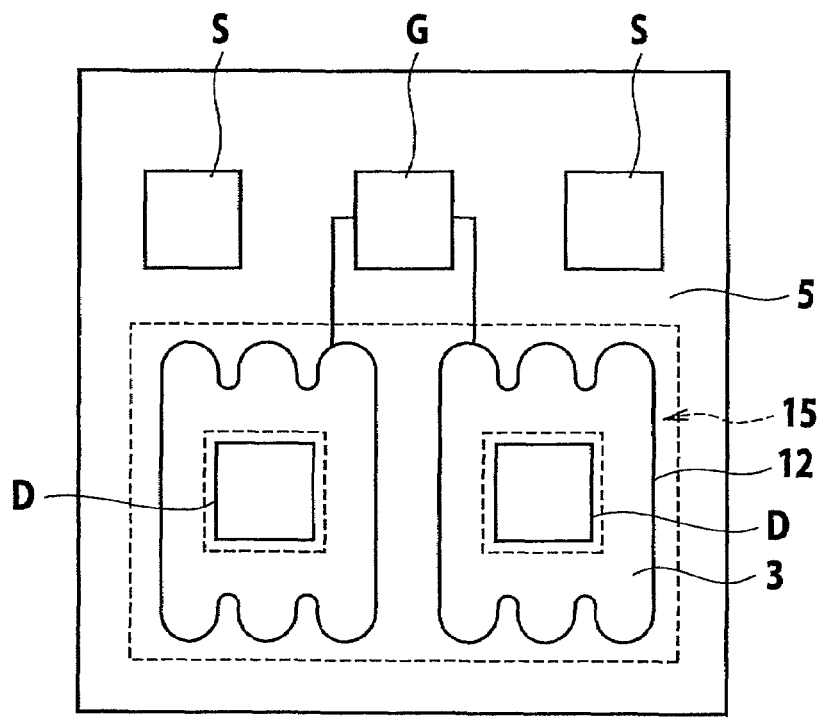
FIG. 6 is a top view showing the configuration of the semiconductor device according to the second embodiment.

A configuration of the semiconductor device according to the second embodiment is explained next with reference to FIG. 5 and FIG. 6.

The configuration of the semiconductor device according to the second embodiment is different from the configuration of the semiconductor device according to the first embodiment only in the configuration of the semiconductor substrate 1. Therefore, only the configuration of the semiconductor substrate 1 is explained below, and explanations of other parts will be omitted. In the second embodiment, a region (a region 15) of the semiconductor substrate 1 positioned below the drain region is removed except a region of the semiconductor substrate 1 immediately below the drain electrode pad D. According to this configuration, the opposing area of the drain region and the semiconductor substrate 1 can be reduced in a similar manner to that of the semiconductor device according to the first embodiment. Therefore, the drain-substrate capacitance Cdsub is reduced, and the output capacitance Coss of the SOI LDMOSFET can be reduced as a result.

Figure 7:
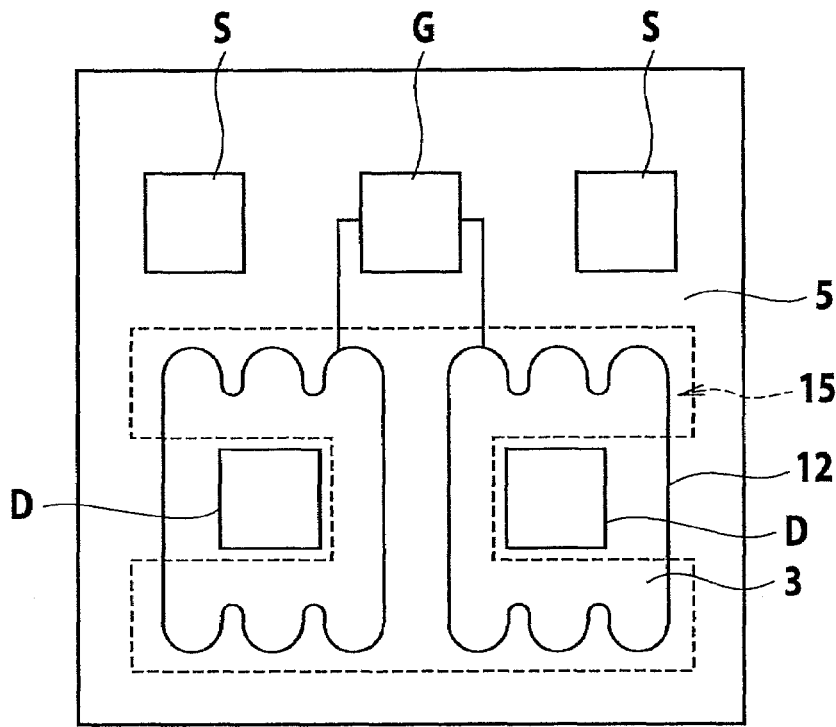
FIG. 7 is a top view showing a configuration of a first modification of the semiconductor device according to the second embodiment.
Figure 8:
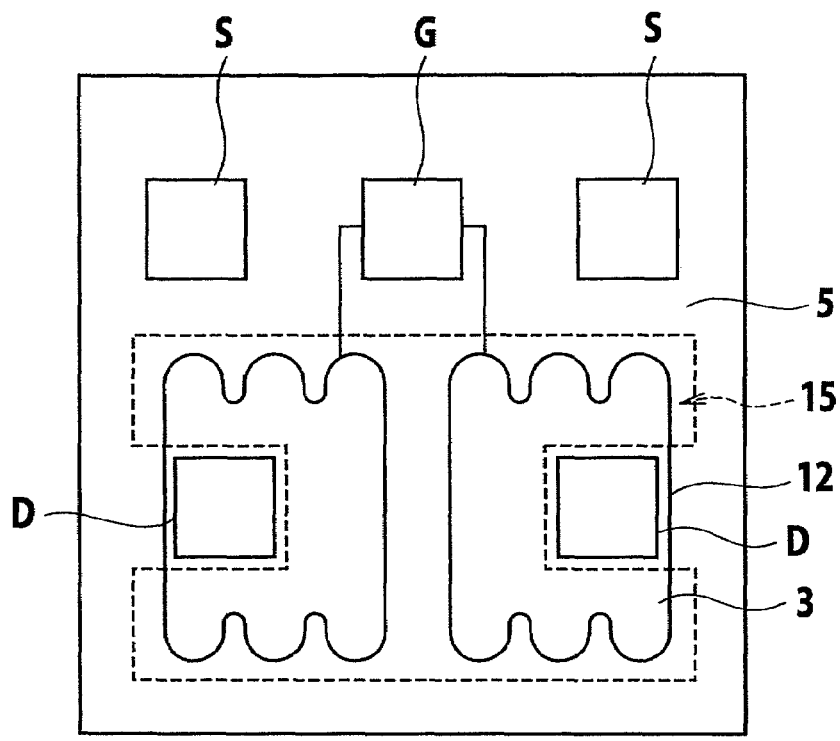
FIG. 8 is a top view showing a configuration of a second modification of the semiconductor device according to the second embodiment.

In this configuration, the region of the semiconductor substrate 1 immediately below the drain electrode pad D is not removed. Therefore, the semiconductor substrate 1 has strength that can sufficiently bear force vertically applied at the time of bonding wires to the drain electrode pad D. Alternatively, as shown in FIG. 7, the semiconductor substrate 1 immediately below the drain electrode pad D can be continuously connected to a surrounding region of the semiconductor substrate 1, thereby increasing strength of the semiconductor substrate 1. In this case, as shown in FIG. 8, preferably, the drain electrode pad D is arranged close to the surrounding region of the semiconductor substrate 1. According to this configuration, the opposing area of the drain region and the semiconductor substrate 1 can be further reduced. Therefore, the output capacitance Coss of the SOI LDMOSFET can be reduced while maintaining the strength of the semiconductor substrate 1.

Description has been made of the embodiments of the invention created by the inventors. However, the present invention is not limited to the descriptions and the drawings, which form a part of the disclosure of the present invention according to these embodiments. Specifically, all of other embodiments, examples, operational techniques and the like, which are made by those skilled in the art based on these embodiments, are incorporated in the scope of the present invention.

What is claimed is:

1. A semiconductor device comprising:
an SOI substrate made of a semiconductor substrate and a semiconductor layer of a first conductivity type formed on the semiconductor substrate via a first insulation layer;
a drain region of the first conductivity type formed within the semiconductor layer so as to be exposed to a surface of the semiconductor layer;
a well region of a second conductivity type formed within the semiconductor layer so as to reach the first insulation layer from the surface of the semiconductor layer, the well region being isolated from the drain region;
a source region of the first conductivity type included inside the well region so as to be exposed to a surface of the well region;
a drain electrode electrically connected to the drain region;
a source electrode electrically connected to the source region;
a gate electrode formed via a second insulation layer on the surface of the well region, the gate electrode being provided between the drain region and the source region; and
a drain electrode pad formed on a surface of the drain electrode, wherein
a region of the semiconductor substrate positioned below the semiconductor layer, except below the drain electrode pad, is removed.

2. The semiconductor device according to claim 1, wherein the region of the semiconductor substrate below the drain electrode pad is continuously connected to other another region of the semiconductor substrate.

3. The semiconductor device according to claim 2, wherein the region of the semiconductor substrate below the drain electrode pad is closely continuously connected to another region of the semiconductor substrate.

4. The semiconductor device according to claim 1, wherein part of the region of the semiconductor substrate which is removed is positioned below the drain region.

5. The semiconductor device according to claim 1, wherein part of the region of the semiconductor substrate which is removed is positioned below a region between the drain region and the well region.

* * * * *

UNITED STATES PATENT AND TRADEMARK OFFICE
CERTIFICATE OF CORRECTION

| | |
|---|---|
| PATENT NO. | : 7,968,943 B2 |
| APPLICATION NO. | : 12/474700 |
| DATED | : June 28, 2011 |
| INVENTOR(S) | : T. Sunada et al. |

It is certified that error appears in the above-identified patent and that said Letters Patent is hereby corrected as shown below:

At column 6, line 10 (claim 2, line 3) of the printed patent, please delete "other" before another.

Signed and Sealed this
Fourteenth Day of February, 2012

David J. Kappos
*Director of the United States Patent and Trademark Office*